United States Patent
Rezzi et al.

(10) Patent No.: US 7,511,649 B1
(45) Date of Patent: Mar. 31, 2009

(54) CIRCUIT FOR CONVERTING A VOLTAGE RANGE OF A LOGIC SIGNAL

(75) Inventors: Francesco Rezzi, Cava Manara (IT); Nicola Ghittori, Pavia (IT); Giovanni Antonio Cesura, Cremona (IT); Shafiq M. Jamal, Gilroy, CA (US); Stefano Marchesi, Pavia (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/846,292

(22) Filed: Aug. 28, 2007

Related U.S. Application Data

(60) Provisional application No. 60/823,836, filed on Aug. 29, 2006.

(51) Int. Cl.
*H03M 1/66* (2006.01)
(52) U.S. Cl. .................. 341/144; 341/135; 341/136; 326/68; 326/80; 326/82; 326/83
(58) Field of Classification Search .......... 341/136, 341/144
See application file for complete search history.

(56) References Cited

U.S. PATENT DOCUMENTS

| | | | |
|---|---|---|---|
| 3,961,326 A | 6/1976 | Craven | |
| 4,825,099 A | 4/1989 | Barton | |
| 4,937,477 A | 6/1990 | Tsoi et al. | |
| 5,028,817 A | 7/1991 | Patil | |
| 5,128,556 A | 7/1992 | Hirakata et al. | |
| 5,539,341 A | 7/1996 | Kuo | |
| 5,625,360 A * | 4/1997 | Garrity et al. | 341/144 |

(Continued)

OTHER PUBLICATIONS

U.S. Appl. No. 11/836,571, filed Aug. 9, 2007, Rezzi et al.

(Continued)

*Primary Examiner*—Khai M Nguyen

(57) ABSTRACT

In a circuit to convert a first logic signal having a first range to a second logic signal having a second range, a first metal oxide semiconductor (MOS) transistor selectively couples an output node to a first reference voltage when the output node is to be in a first state. A second MOS transistor has a source coupled to the output node and a gate coupled to a bias voltage. A current source circuit selectively biases the second MOS transistor to act as part of a source-follower circuit when the output node is to be in a second state. Additionally, a memory circuit has an input coupled to the output node, and an output. The memory circuit is configured to temporarily store a Boolean value of the output node when the output node transitions from the first state to the second state. Further, a discharging circuit is coupled to the output node and a second reference voltage. The discharging circuit is configured to temporarily provide a discharging path between the output node and the second reference voltage when the output node is transitioning from the first state to the second state. The discharging circuit has a first input coupled to the output of the memory circuit and a second input coupled to a control signal. The control signal indicates that the output node is to transition from the first state to the second state.

38 Claims, 8 Drawing Sheets

U.S. PATENT DOCUMENTS

| | | |
|---|---|---|
| 5,751,186 A | 5/1998 | Nakao |
| 5,900,741 A | 5/1999 | Roohparvar |
| 5,909,187 A | 6/1999 | Ahuja |
| 6,100,830 A * | 8/2000 | Dedic .................. 341/136 |
| 6,188,244 B1 | 2/2001 | Joo et al. |
| 6,339,344 B1 | 1/2002 | Sakata et al. |
| 6,407,688 B1 * | 6/2002 | Greig .................. 341/136 |
| 7,023,367 B1 * | 4/2006 | Manganaro .......... 341/136 |
| 7,034,733 B2 * | 4/2006 | Dedic et al. .......... 341/150 |

OTHER PUBLICATIONS

U.S. Appl. No. 11/836,584, filed Aug. 9, 2007, Rezzi et al.
U.S. Appl. No. 11/836,619, filed Aug. 9, 2007, Rezzi et al.
U.S. Appl. No. 11/836,628, filed Aug. 9, 2007, Rezzi et al.
U.S. Appl. No. 11/836,635, filed Aug. 9, 2007, Rezzi et al.
Office Action in U.S. Appl. No. 11/836,619, dated Oct. 29, 2008.
Interview Summary in U.S. Appl. No. 11/836,619, dated Nov. 10, 2008.

* cited by examiner

CIRCUIT FOR CONVERTING A VOLTAGE RANGE OF A LOGIC SIGNAL

CROSS-REFERENCES TO RELATED APPLICATIONS

The present application claims the benefit of U.S. Provisional Application No. 60/823,836, entitled "DAC DRIVER WITH NMOS SOURCE FOLLOWER+DISCHARGING NMOS+LATCH," filed on Aug. 29, 2006, which is hereby incorporated by reference herein in its entirety.

FIELD OF TECHNOLOGY

The present disclosure relates generally to digital circuits, and more particularly, to circuits for converting signals that vary in a first voltage range to signals that vary in a second voltage range.

DESCRIPTION OF THE RELATED ART

Typical current steering digital-to-analog converters (DACs) comprise a plurality of cells, each cell selectively supplying a current to a current summing line based on the digital value that is to be converted. The total current selectively supplied by all of the cells corresponds to the digital value, and different digital values will result in different amounts of total current.

For instance, FIG. 1 is a block diagram of an example current steering DAC 100 having a plurality of cells 104, 108, 112, and 116. Each of the cells 104, 108, 112, 116 includes an output coupled to a current summing line 120. Digital data that is to be converted may be supplied to each of the cells 104, 108, 112, 116. Each of the cells 104, 108, 112, 116 cells includes a current source and a switch that selectively, based on the digital data, applies current from the current source to the summing line 120. The total current on the summing line 120 will correspond to the digital value, and different digital values will result in different amounts of total current on the summing line 120.

FIG. 2 is a block diagram of an example cell 150 that may be utilized in the current steering DAC 100 of FIG. 1. The cell 150 includes a current source 154 and a switch comprising a p-channel metal oxide semiconductor (PMOS) transistor 158 and a PMOS transistor 162. A source of the transistor 158 is coupled to the current source 154, and a drain of the transistor 158 is coupled to the summing line 120. A source of the transistor 162 is coupled to the current source 154, and a drain of the transistor 158 is coupled to ground. The cell 150 also includes logic 166 that receives the digital data that is to be converted and generates a switch control signal based on the digital data. The switch control signal is coupled to a gate of the transistor 158 and is coupled to an input of an inverter 170. An output of the inverter 170 is coupled to a gate of the transistor 162.

In operation, the logic 166 will generate either a low signal (e.g., 0 volts) or a high signal (e.g., 1.2 volts) depending upon a value of the digital data. If a value of the digital data results in the logic 166 generating a low signal, the transistor 158 will be turned ON. Additionally, the inverter 170 will generate a high signal, and thus the transistor 162 will be turned OFF. This will result in the current source 154 being coupled to the summing line 120. Thus, the current source 154 will supply its current to the summing line 120. On the other hand, if a value of the digital data results in the logic 166 generating a high signal, the transistor 158 will be turned OFF. Additionally, the inverter 170 will generate a low signal, and thus the transistor 162 will be turned ON. This will result in the current source 154 being coupled to ground. Thus, the current source 154 will not supply any of its current to the summing line 120.

SUMMARY OF THE DISCLOSURE

In one embodiment, a circuit to convert a first logic signal having a first range to a second logic signal having a second range comprises a first metal oxide semiconductor (MOS) transistor to selectively couple an output node to a first reference voltage when the output node is to be in a first state, and a second MOS transistor having a source coupled to the output node and a gate coupled to a bias voltage. The circuit also comprises a current source circuit to selectively bias the second MOS transistor to act as part of a source-follower circuit when the output node is to be in a second state. Additionally, the circuit comprises a memory circuit having an input coupled to the output node and an output, the memory circuit configured to temporarily store a value indicative of the output node in the first state when the output node transitions from the first state to the second state.

Further, the circuit comprises a discharging circuit coupled to the output node and a second reference voltage. The discharging circuit is configured to temporarily provide a discharging path between the output node and the second reference voltage when the output node is transitioning from the first state to the second state. The discharging circuit has a first input coupled to the output of the memory circuit and a second input coupled to a control signal, wherein the control signal is to indicate that the output node is to transition from the first state to the second state.

In another embodiment, a circuit to convert a first logic signal having a first range to a pair of complementary second logic signals having a second range includes a MOS transistor to selectively couple a first output node to a first reference voltage when the first output node is to be in a first state, and a second MOS transistor having a source coupled to the first output node and a gate coupled to a bias voltage. The circuit additionally includes a third MOS transistor to selectively couple a second output node to the first reference voltage when the second output node is to be in the first state, and a fourth MOS transistor having a source coupled to the second output node and a gate coupled to the bias voltage.

The circuit also includes a current source circuit to selectively bias the second MOS transistor to act as part of a first source-follower circuit when the first output node is to be in a second state and to selectively bias the fourth MOS transistor to act as part of a second source-follower circuit when the second output node is to be in the second state. Further, the circuit includes a memory circuit having a first input coupled to the first output node, a second input coupled to the second output node, a first output, and a second output, the memory circuit configured to temporarily store a first value indicative of the first output node in the first state when the first output node transitions from the first state to the second state and to temporarily store a second value indicative of the second output node in the first state when the second output node transitions from the first state to the second state.

Still further, the circuit includes a first discharging circuit coupled to the first output node and a second reference voltage. The first discharging circuit is configured to temporarily provide a discharging path between the first output node and the second reference voltage when the first output node is transitioning from the first state to the second state. The first discharging circuit has a first input coupled to the first output of the memory circuit and a second input coupled to a first control signal, wherein the first control signal indicating that the first output node is to transition from the first state to the second state. Additionally, the circuit includes a second discharging circuit coupled to the second output node and the second reference voltage. The second discharging circuit is configured to temporarily provide a discharging path between the second output node and the second reference voltage when the second output node is transitioning from the first state to the second state. The second discharging circuit has a first input coupled to the second output of the memory circuit and a second input coupled to a second control signal, wherein the second control signal indicating that the second output node is to transition from the first state to the second state.

In yet another embodiment, a circuit to convert a first logic signal having a first range to at least one second logic signal having a second range comprises a p-channel metal oxide semiconductor (PMOS) transistor having a gate coupled to a control signal, a source coupled to a first reference voltage, and a drain coupled to an output node. The circuit also comprises an n-channel metal oxide semiconductor (NMOS) transistor having a source coupled to the output node and a gate coupled to a bias voltage. The circuit additionally comprises a current source circuit having an input coupled to the control signal to selectively bias the first NMOS transistor to act as part of a source-follower circuit when the control signal is HIGH.

Further, the circuit comprises a memory circuit having a first input coupled to the output node and an output, the memory circuit configured to temporarily store a representative value associated with the output node when the control signal changes from LOW to HIGH. Still further, the circuit comprises a discharging circuit coupled to the output node and a second reference voltage, the discharging circuit configured to temporarily provide a discharging path between the output node and the second reference voltage after the control signal changes from LOW to HIGH. The discharging circuit having a first input coupled to the output of the memory circuit and a second input coupled to the control signal. A steady-state voltage of the output node when the control signal is HIGH is a voltage within the range 100 millivolts and 350 millivolts, inclusive.

In still another embodiment, a cell of a current steering digital-to-analog converter (DAC) includes a cell current source, a MOS transistor coupled in series with the current source and coupled to a current summing line, and a second MOS transistor coupled in series with the current source and coupled to a reference node.

The cell of the DAC also includes a driver circuit having an input, a first output coupled to a gate of the first MOS transistor, and a second output coupled to a gate of the second MOS transistor. The driver circuit comprises a third MOS transistor to selectively couple the first output of the driver circuit to a first reference voltage when the first output of the driver circuit is to be in a first state, and a fourth MOS transistor having a source coupled to the first output of the driver circuit and a gate coupled to a bias voltage. The driver circuit additionally comprises a fifth MOS transistor to selectively couple the second output of the driver circuit to the first reference voltage when the second output of the driver circuit is to be in the first state, and a sixth MOS transistor having a source coupled to the second output of the driver circuit and a gate coupled to the bias voltage.

The driver circuit further comprises a driver circuit current source circuit to selectively bias the fourth MOS transistor to act as part of a first source-follower circuit when the first output of the driver circuit is to be in a second state and to selectively bias the sixth MOS transistor to act as part of a second source-follower circuit when the second output of the driver circuit is to be in the second state. The driver circuit still further comprises a memory circuit having a first input coupled to the first output of the driver circuit, a second input coupled to the second output of the driver circuit, a first output, and a second output. The memory circuit is configured to temporarily store a first representative value associated with the first output of the driver circuit when the first output of the driver circuit transitions from the first state to the second state and to temporarily store a second representative value associated with the second output of the driver circuit when the second output of the driver circuit transitions from the first state to the second state.

Still further, the driver circuit comprises a first discharging circuit coupled to the first output of the driver circuit and a second reference voltage. The first discharging circuit is configured to temporarily provide a discharging path between the first output of the driver circuit and the second reference voltage when the first output of the driver circuit is transitioning from the first state to the second state. The first discharging circuit has a first input coupled to the first output of the memory circuit and a second input coupled to a first control signal, wherein the first control signal indicating that the first output of the driver circuit is to transition from the first state to the second state. Additionally, the driver circuit comprises a second discharging circuit coupled to the second output of the driver circuit and the second reference voltage. The second discharging circuit is configured to temporarily provide a discharging path between the second output of the driver circuit and the second reference voltage when the second output of the driver circuit is transitioning from the first state to the second state. The second discharging circuit has a first input coupled to the second output of the memory circuit and a second input coupled to a second control signal, wherein the second control signal indicating that the second output of the driver circuit is to transition from the first state to the second state.

A steady-state voltage of the first output of the driver circuit in the second state is a voltage within the range 100 millivolts to 350 millivolts, inclusive. A steady-state voltage of the second output of the driver circuit in the second state is a voltage within the range 100 millivolts to 350 millivolts, inclusive.

DETAILED DESCRIPTION

Figure 1:
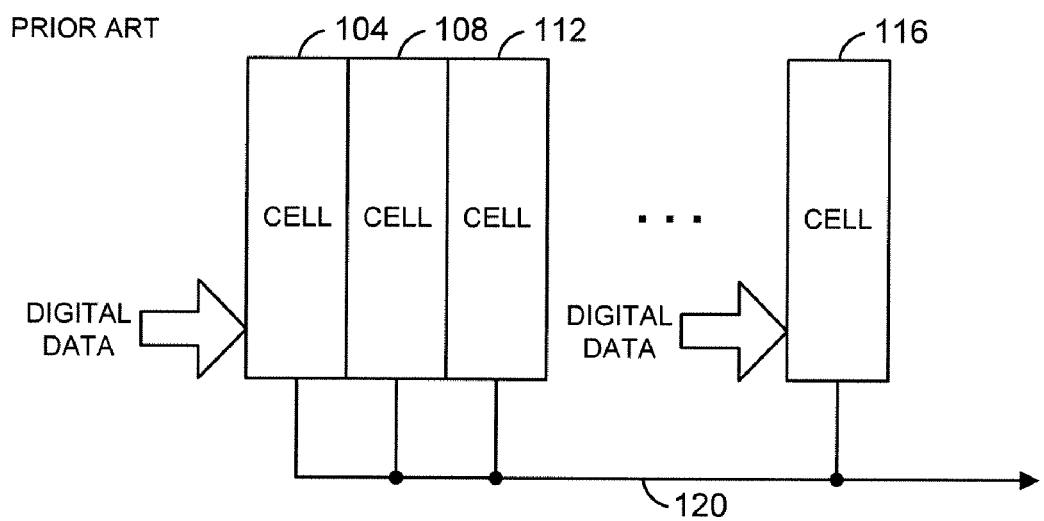
FIG. 1 a block diagram of an example current steering digital-to-analog converter (DAC)
Figure 2:
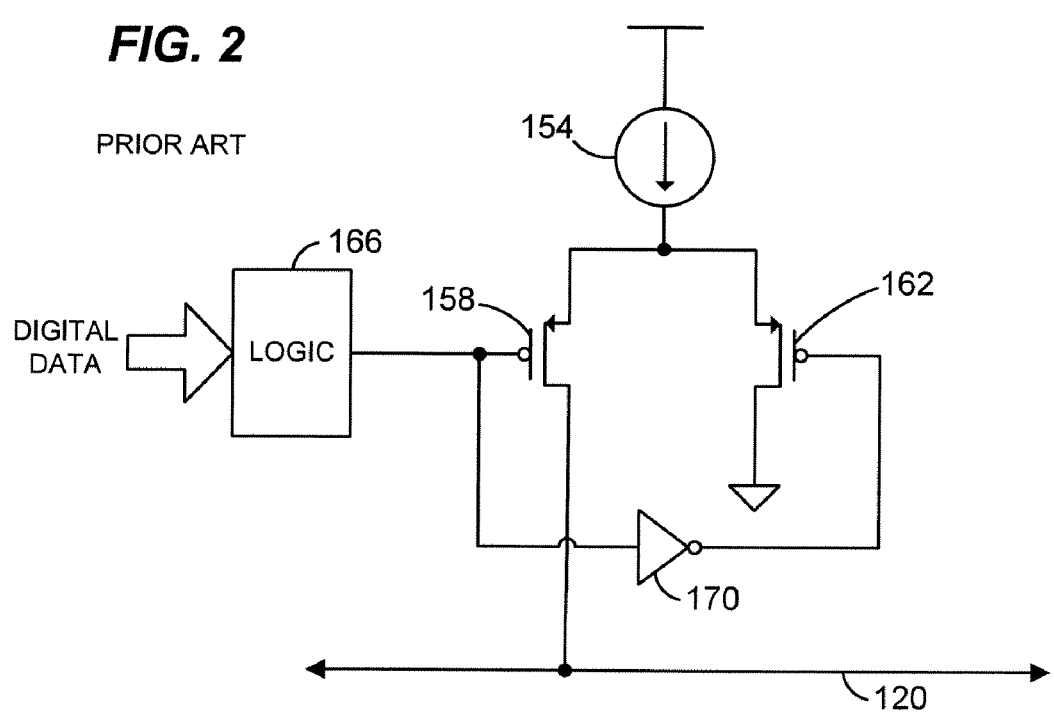
FIG. 2 is a circuit diagram of a cell of the current steering DAC of FIG. 1.
Figure 3:
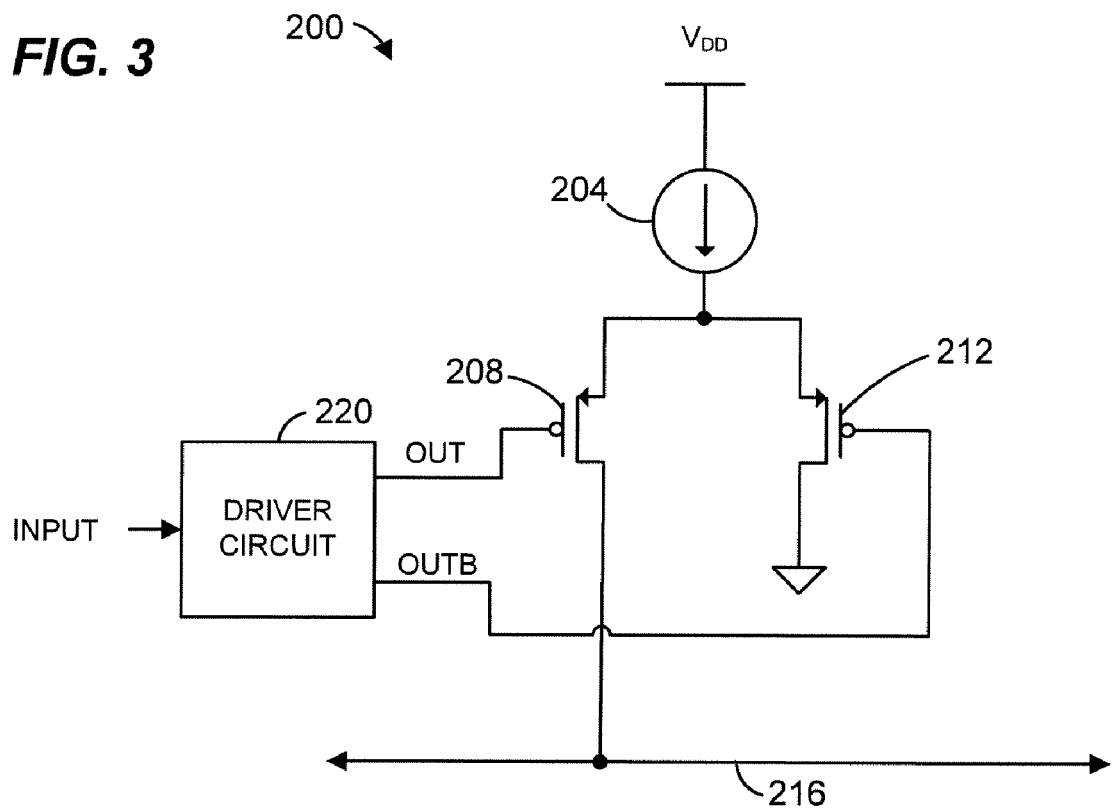
FIG. 3 is a circuit diagram of another cell that may be utilized in a current steering DAC.

FIG. 3 is a block diagram of an example cell 200 that may be utilized in a current steering DAC. The cell 200 includes a current source 204 and a switch comprising a p-channel metal oxide semiconductor (PMOS) transistor 208 and a PMOS transistor 212. A source of the transistor 208 is coupled to the current source 204, and a drain of the transistor 208 is coupled to a summing line 216. A source of the transistor 212 is coupled to the current source 204, and a drain of the transistor 212 is coupled to ground. The cell 200 also includes a driver circuit 220 that receives an input signal and generates two output signals based on the input signal. The input signal is indicative of whether the current source 204 should be coupled to or isolated from the summing line 216. The input signal may be generated by logic such as the logic block 166 of FIG. 2.

The two output signals control the transistors 208, 212 to selectively couple the current source 204 to the summing line 216. One of the output signals, OUT, is coupled to a gate of the transistor 208. The output signal, OUTB, is coupled to a gate of the transistor 212. The input signal coupled to the driving circuit 220 will vary between voltages levels for a typical CMOS device. For example, the input signal may vary between 0 volts and 1.2 volts. An input signal of approximately 0 volts may indicate that the current source 204 should be coupled to the summing line 216, and an input signal of approximately 1.2 volts may indicate that the current source 204 should be isolated from the summing line 216, for example. Alternatively, an input signal of approximately 1.2 volts may indicate that the current source 204 should be coupled to the summing line 216, and an input signal of approximately 0 volts may indicate that the current source 204 should be isolated from the summing line 216, for example.

The driving circuit 220 generates the output signals such that they vary in a range that is less than the range of that of the input signal. For example, if the input signal varies between approximately 0 volts and 1.2 volts, the output signals may vary between approximately 300 millivolts and 1.2 volts, for example, or some other range. It has been found that, in at least some implementations, using such a reduced range reduces charge injection associated with the transistors 208, 212. It also has been found that, in at least some implementations, using such a reduced range tends to keep the transistors 208, 212 biased in a desired region, such as in saturation.

In operation, when the input signal is HIGH (in the standard CMOS range), the driver circuit 220 will generate the signal OUT to be HIGH (in the reduced range) and will generate the signal OUTB to be LOW (in the reduced range). Similarly, when the input signal is LOW (in the standard CMOS range), the driver circuit 220 will generate the signal OUT to be LOW (in the reduced range) and will generate the signal OUTB to be HIGH (in the reduced range). As a specific example provided merely for explanatory purposes, if the input signal is 1.2 volts, the driver circuit 220 will generate the signal OUT to be 1.2 volts and will generate the signal OUTB to be 300 millivolts. Continuing with this example, if the input signal is 0 volts, the driver circuit 220 will generate the signal OUT to be 300 millivolts and will generate the signal OUTB to be 1.2 volts.

Figure 4:
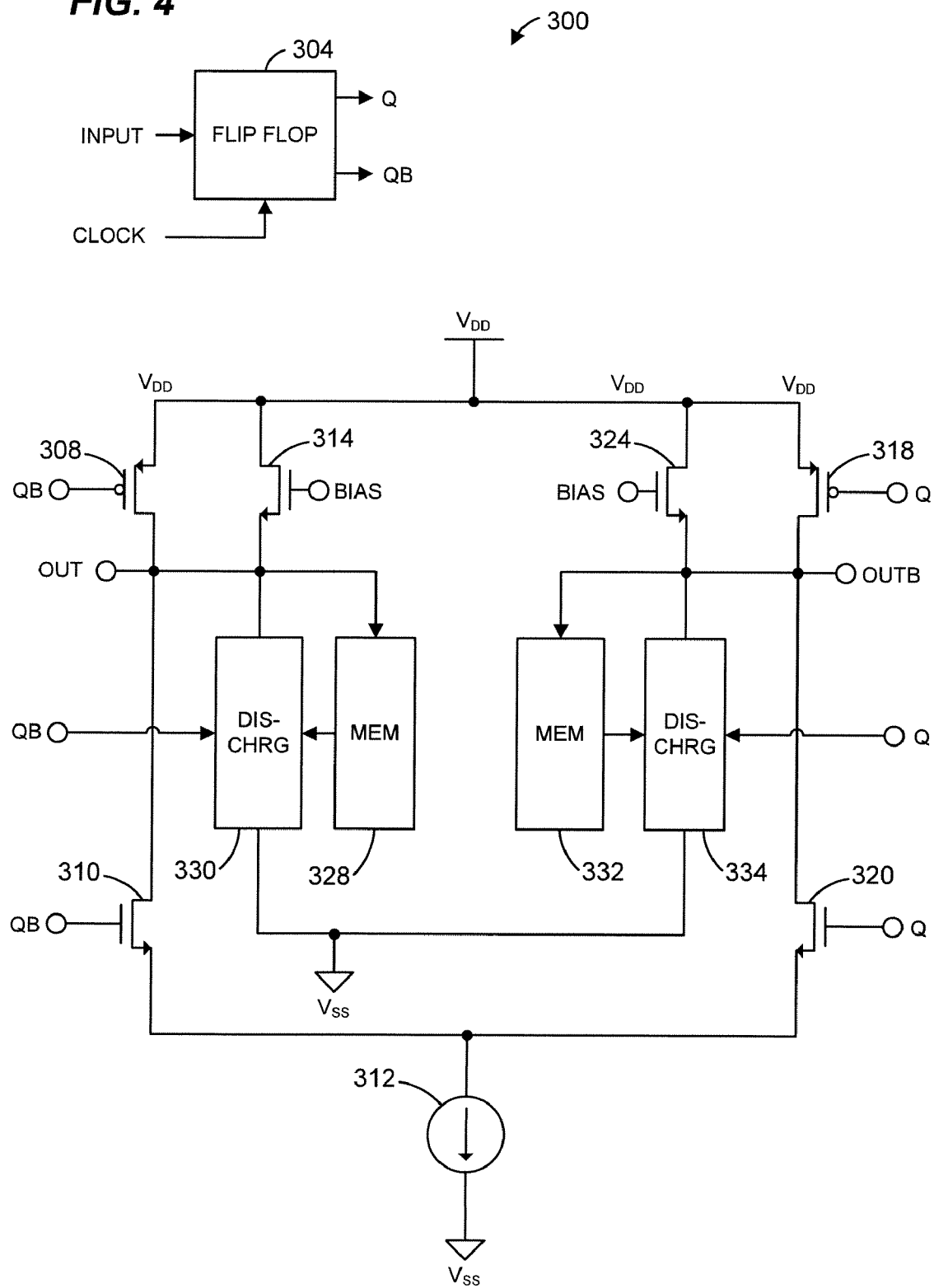
FIG. 4 is a circuit diagram of an example driver circuit that may be utilized in the cell of FIG. 3.

FIG. 4 is a circuit diagram of one example of a driving circuit 300 that may be used as the driving circuit 220 of FIG. 3. The driving circuit 300 includes a flip flop 304. The flip flop 304 includes a data input coupled to the input signal and a clock input coupled to a clock signal. The clock signal may be a clock signal of a DAC for example. The flip flop 304 generates a Q signal and a QB signal. The Q signal corresponds to the input signal, and the QB signal corresponds to a logical complement of the input signal.

The driving circuit 300 also includes a PMOS transistor 308 having a source coupled to a reference voltage $V_{DD}$, a drain coupled to a node OUT, and a gate coupled to the QB signal. The reference voltage $V_{DD}$ may be 1.2 volts, for example, or any other suitable reference voltage. An n-channel metal oxide semiconductor (NMOS) transistor 310 has a drain coupled to the node OUT and a gate coupled to the QB signal. A source of the NMOS transistor 310 is coupled to an input node of a current source 312. An output node of the current source 312 is coupled to a reference voltage $V_{SS}$. The reference voltage $V_{SS}$ may be ground, for example, or any other suitable reference voltage. An NMOS transistor 314 has a drain coupled to the reference voltage $V_{DD}$, a source coupled to the node OUT, and a gate coupled to a bias voltage (BIAS).

A PMOS transistor 318 has a source coupled to $V_{DD}$, a drain coupled to a node OUTB, and a gate coupled to the Q signal. An NMOS transistor 320 has a drain coupled to the node OUTB, a source coupled to the input node of a current source 312, and a gate coupled to the Q signal. An NMOS transistor 324 has a drain coupled to the reference voltage $V_{DD}$, a source coupled to the node OUTB, and a gate coupled to the BIAS voltage.

The driving circuit 300 further includes a memory circuit 328. The memory circuit 328 is configured to temporarily hold the Boolean value of the node OUT so that when the node OUT is transitioning from a HIGH value to a LOW value, the stored value temporarily remains HIGH. One example memory circuit will be described below, but one of ordinary skill in the art will recognize that any of a variety of memory circuits may be utilized.

A discharging circuit 330 receives an output from the memory circuit 228 as well as the QB signal. The discharging circuit 330 is configured to temporarily provide a discharging path from the node OUT to the reference voltage $V_{SS}$ when the node OUT is transitioning from a HIGH value to a LOW value. In particular, the discharging circuit 330 is configured to provide the discharging path when QB is HIGH and when the output of the memory circuit 328 has not yet changed in response to the node OUT transitioning from HIGH to LOW. One example discharging circuit will be described below, but one of ordinary skill in the art will recognize that any of a variety of discharging circuits may be utilized.

The driving circuit 300 further includes a memory circuit 332 and a discharging circuit 334 which may be the same as or similar to the memory circuit 228 and the discharging circuit 330, respectively. For instance, the memory circuit 332 is configured to temporarily hold the Boolean value of the node OUTB so that when the node OUTB is transitioning from a HIGH value to a LOW value, the stored value temporarily remains HIGH. Also, the discharging circuit 334 is configured to temporarily provide a discharging path from the node OUTB to the reference voltage $V_{SS}$ when the node OUTB is transitioning from a HIGH value to a LOW value. In particular, the discharging circuit 334 is configured to provide the discharging path when Q is HIGH and when the output of the memory circuit 332 has not yet changed in response to the node OUTB transitioning from HIGH to LOW.

Operation of the driving circuit 300 will now be described. First, assume that the input signal is HIGH, the Q signal is HIGH, and the QB signal is LOW. In this state, the transistor 308 is ON, and the transistor 310 is OFF. Thus, the node OUT is approximately $V_{DD}$. Also, the memory circuit 328 stores the Boolean value HIGH because the node OUT is approximately $V_{DD}$. Further, the discharging circuit 330 isolates the node OUT from the discharging path to the reference voltage $V_{SS}$ of the discharging circuit 330.

Additionally, the transistor 318 is OFF, and the transistor 320 is ON. Further, the transistor 324 is biased by current drawn by the current source 312. As will be described in more detail below, the node OUTB is some desired voltage above $V_{SS}$, and this voltage will be referred to as $V_{MIN}$.

Now, if the input signal transitions to LOW, the Q signal will transition to LOW and the QB signal will transition to HIGH in response to a clock event such as a rising edge. Thus, the transistor 308 will turn OFF and the transistor 310 will turn ON. Also, the transistor 318 will turn ON and the transistor 320 will turn OFF. This will cause the current drawn by the current source 312 to flow through the transistor 314.

When the signal QB initially goes HIGH, the output of the memory circuit 328 does not change. As a result, the discharging circuit 330 creates a discharging path between the node OUT and $V_{SS}$. This causes the voltage of the node OUT to fall towards $V_{SS}$. Eventually, the output of the memory circuit 328 will change, causing the discharging circuit 330 to isolate the node OUT from the discharging path of the discharging circuit 330.

The transistor 314 and the current source 312 act as an NMOS source-follower circuit. The eventual voltage of the node OUT will be the voltage of BIAS minus $V_{GS}$ of the transistor 314. The node OUT can be made to fall to the desired voltage $V_{MIN}$ by appropriately selecting BIAS in light of a known value of $V_{GS}$ of the transistor 314 when the current of the current source 312 flows through the transistor 314. For example, BIAS could be set as $V_{MIN}+V_{GS}$. In one specific implementation, the voltage $V_{MIN}$ may be approximately 300 millivolts. It is to be understood, however, that other values of $V_{MIN}$ may be utilized as well. For example, the voltage $V_{MIN}$ may be approximately 100 millivolts, 125 millivolts, 150 millivolts, 175 millivolts, 200 millivolts, 225 millivolts, 250 millivolts, 275 millivolts, 325 millivolts, 350 millivolts, etc. Thus, the voltage BIAS and the current from current source 320 can be selected to provide a desired value of $V_{MIN}$.

With regard to the node OUTB, the transistor 318 turns ON, and the transistor 320 turns OFF. Thus, the node OUTB will be pulled to approximately $V_{DD}$. In steady state, the memory circuit 332 stores the Boolean value HIGH because the node OUTB is approximately $V_{DD}$. Further, the discharging circuit 334 isolates the node OUTB from the discharging path to the reference voltage $V_{SS}$ of the discharging circuit 334.

Now, if the input signal transitions to HIGH, the Q signal will transition to HIGH and the QB signal will transition to LOW in response to a clock event such as a rising edge. Thus, the transistor 318 will turn OFF and the transistor 320 will turn ON. Also, the transistor 308 will turn ON and the transistor 310 will turn OFF. This will cause the current drawn by the current source 312 to flow through the transistor 324.

When the signal Q initially goes HIGH, the output of the memory circuit 332 does not change. As a result, the discharging circuit 334 creates a discharging path between the node OUTB and $V_{SS}$. This causes the voltage of the node OUTB to fall towards $V_{SS}$. Eventually, the output of the memory circuit 332 will change, causing the discharging circuit 334 to isolate the node OUTB from the discharging path of the discharging circuit 334.

The transistor 324 and the current source 312 act as an NMOS source-follower circuit. The eventual voltage of the node OUT will be the voltage of BIAS minus $V_{GS}$ of the transistor 324. The node OUT can be made to fall to the desired voltage $V_{MIN}$ by appropriately selecting BIAS in light of a known value of $V_{GS}$ of the transistor 324 when the current of the current source 312 flows through the transistor 324. For example, BIAS could be set as $V_{MIN}+V_{GS}$. In one specific implementation, the voltage $V_{MIN}$ may be approximately 300 millivolts. It is to be understood, however, that other values of $V_{MIN}$ may be utilized as well.

With regard to the node OUT, the transistor 308 turns ON, and the transistor 310 turns OFF. Thus, the node OUT will be pulled to approximately $V_{DD}$.

As can be seen in the example driving circuit 300, the current of the current source 312 is selectively directed to either bias the transistor 314 or the transistor 324. In other words, only one of the transistors 312 and 324 is biased at a time. This may help to keep overall power usage down in a current steering DAC with many cells.

One of ordinary skill in the art will recognize many variations to the example circuit 300. For example, if a complement output is not needed, portions of the circuit 300 may be omitted. For instance, the transistors 318 and 320, the memory circuit 332, and the discharging circuit 334 could be omitted and the drain of the transistor 320 could be coupled to a diverting node such as $V_{DD}$. Also, the transistor 320 could be omitted and the current source 312 could be configured to draw current only if QB is HIGH, for example.

As another example, the flip-flop 304 may be omitted. For instance, the input signal could be coupled to the gates of the transistors 318 and 320 and to the discharging circuit 334. Also, the circuit could include an inverter having an input coupled to the input signal and an output coupled to the gates of the transistors 308 and 310 and to the discharging circuit 330. Still further, in some implementations the output node OUTB may track the input signal and/or the output node OUT may be complementary to the input signal. In such implementations, the control signals Q and QB may be swapped. For example, the control signal Q could be coupled to the gates of transistors 308 and 310 and to the discharging circuit 330. Similarly, the control signal QB could be coupled to the gates of transistors 318 and 320 and to the discharging circuit 334. Still further, separate bias voltages could be used for the transistors 314 and 324. This could be useful, for example, if different $V_{MIN}$ values for the node OUT and the node OUTB are desired.

As yet another variation, the memory circuit 328 may be coupled to the node OUTB and may be configured to temporarily hold the Boolean value of the node OUTB so that when the node OUTB is transitioning from a LOW value to a HIGH value, the stored value temporarily remains LOW. Also, the discharging circuit 330 may be coupled to the signal Q or the QB signal and may be configured to temporarily provide a discharging path from the node OUT to the reference voltage $V_{SS}$ when the node OUTB is transitioning from a LOW value to a HIGH value. In particular, the discharging circuit 330 may be configured to provide the discharging path when Q is LOW or QB is HIGH and when the output of the memory circuit 328 has not yet changed in response to the node OUTB transitioning from LOW to HIGH. In this implementation, the discharging circuit 330 still acts to temporarily provide a discharging path from the node OUT to the reference voltage $V_{SS}$ when the node OUT is transitioning from HIGH to LOW because this occurs when OUTB is transitioning from LOW to HIGH. Similarly, the memory circuit 332 may be coupled to the node OUT and may be configured to temporarily hold the Boolean value of the node OUT so that when the node OUT is transitioning from a LOW value to a HIGH value, the stored value temporarily remains LOW. Also, the discharging circuit 334 may be coupled to the signal Q or the signal QB and may be configured to temporarily provide a discharging path from the node OUTB to the reference voltage $V_{SS}$ when the node OUT is transitioning from a LOW value to a HIGH value. In particular, the discharging circuit 334 may be configured to provide the discharging path when Q is HIGH or QB is LOW and when the output of the memory circuit 332 has not yet changed in response to the node OUT transitioning from LOW to HIGH. The discharging circuit 334 still acts to temporarily provide a discharging path from the node OUTB to the reference voltage $V_{SS}$ when the node OUTB is transitioning from HIGH to LOW because this occurs when OUT is transitioning from LOW to HIGH.

One or ordinary skill in the art will recognize many other variations.

Figure 5:
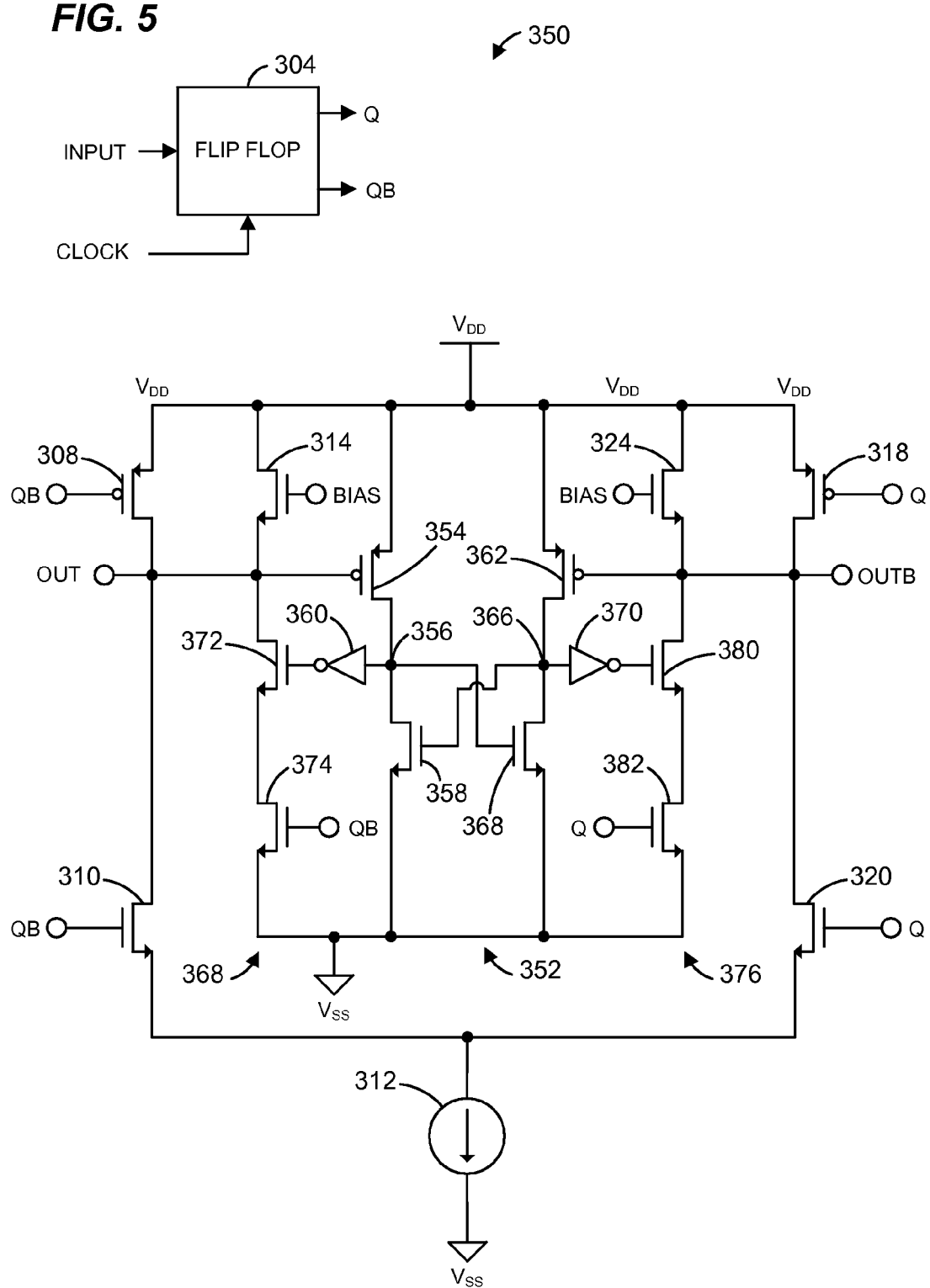
FIG. 5 is a circuit diagram of another example driver circuit that may be utilized in the cell of FIG. 3.

FIG. 5 is a circuit diagram of another example driving circuit 350 that may be used as the driving circuit 220 of FIG. 3. The driving circuit 350 includes many of the same elements as the driving circuit 300 of FIG. 4, and these elements are like numbered. Additionally, the driving circuit 350 includes particular example implementations of the memory circuit 328, the discharging circuit 330, the memory circuit 332, and the discharging circuit 334. Of course, it is to be understood that many other implementations of the memory circuit 328, the discharging circuit 330, the memory circuit 332, and the discharging circuit 334 additionally may be utilized as well, and one of ordinary skill in the art will recognize many other such implementations.

In the driving circuit 350, the memory circuit 328 and the memory circuit 332 are implemented as a latch circuit 352. The latch circuit 352 comprises a PMOS transistor 354 having a source coupled to $V_{DD}$, a drain coupled to a node 356, and a gate coupled to the OUT node. An NMOS transistor 358 has a drain coupled to the node 356 and a source coupled to $V_{SS}$. An inverter 360 has an input coupled to the node 356. The latch circuit further comprises a PMOS transistor 362 having a source coupled to $V_{DD}$, a drain coupled to a node 366, and a gate coupled to the OUTB node. An NMOS transistor 368 has a drain coupled to the node 366 and a source coupled to $V_{SS}$. An inverter 370 has an input coupled to the node 366. A gate of the NMOS transistor 358 is coupled to the node 366 and a gate of the NMOS transistor 368 is coupled to the node 356.

In the driving circuit 350, the discharging circuit 330 is implemented as a circuit 368. The discharging circuit 368 comprises an NMOS transistor 372 having a drain coupled to the OUT node and a gate coupled to an output of the inverter 360. An NMOS transistor 374 has a drain coupled to a source of the NMOS transistor 372, a source coupled to $V_{SS}$, and a gate coupled to the QB signal.

Similarly, in the driving circuit 350, the discharging circuit 334 is implemented as a circuit 376. The discharging circuit 376 comprises an NMOS transistor 380 having a drain coupled to the OUTB node and a gate coupled to an output of the inverter 370. An NMOS transistor 382 has a drain coupled to a source of the NMOS transistor 380, a source coupled to $V_{SS}$, and a gate coupled to the Q signal.

In operation, when the input signal is HIGH in steady state, Q is HIGH and QB is LOW. Thus, the node OUT is at approximately $V_{DD}$ and the node OUTB is at approximately $V_{MIN}$. The PMOS transistor 362 is ON, thus the node 366 is at approximately $V_{DD}$. Thus, the transistor 358 is ON. Also, the transistor 354 is OFF. As a result, the node 356 is approximately at $V_{SS}$. Thus, the output of the inverter 360 is HIGH and the output of the inverter 370 is LOW.

Because the output of the inverter 360 is HIGH, the transistor 372 is ON. But because the QB signal is LOW, the transistor 374 is OFF. Thus the discharging circuit 368 isolates the node OUT from $V_{SS}$. Similarly, because the output of the inverter 370 is LOW, the transistor 380 is OFF and the discharging circuit 376 isolates the node OUTB from the discharging path to $V_{SS}$.

When the input signal transitions from HIGH to LOW, Q will transition from HIGH to LOW and QB will transition from LOW to HIGH in response to a clock event such as a rising edge. This will cause the transistor 374 to turn ON which in turn creates a discharging path between the node OUT and $V_{SS}$. This causes voltage at the node OUT to fall towards $V_{SS}$. This will eventually cause the transistor 354 to turn ON and pull the node 356 towards $V_{DD}$. Then, the output of the inverter 360 will transition from HIGH to LOW, causing the transistor 372 to turn OFF. This again isolates the discharging path of the discharging circuit 368 from the node OUT.

As described with respect to FIG. 4, when the signal Q goes LOW, the transistor 318 turns ON and the node OUTB rises toward $V_{DD}$. This will cause the transistor 362 to turn OFF and the node 366 is isolated from $V_{DD}$. Also, as voltage at the node 356 rises, the transistor 368 will turn ON pulling the node 366 toward $V_{SS}$. Eventually, the output of the inverter 370 will transition from LOW to HIGH. This turns the transistor 380 ON. But because the signal Q is low, the transistor 382 is OFF and the node OUTB remains isolated from $V_{SS}$.

When the circuit 350 reaches steady state, the node 356 is HIGH and the node 366 is LOW. Thus, the transistor 372 is OFF and the transistor 380 is ON. Because the transistor 372 is OFF, the discharging circuit 368 isolates the node OUT from the discharging path to $V_{SS}$. Because the Q signal is LOW, the transistor 382 is OFF and the discharging circuit 376 isolates the node OUT from $V_{SS}$.

When the input signal transitions from LOW to HIGH, Q will transition from LOW to HIGH and QB will transition from HIGH to LOW in response to a clock event such as a rising edge. This will cause the transistor 382 to turn ON which in turn creates a discharging path between the node OUTB and $V_{SS}$. This causes voltage at the node OUTB to fall towards $V_{SS}$. This will eventually cause the transistor 362 to turn ON and pull the node 366 towards $V_{DD}$. Then, the output of the inverter 370 will transition from HIGH to LOW, causing the transistor 380 to turn OFF. This again isolates the discharging path of the discharging circuit 376 from the node OUTB.

As described with respect to FIG. 4, when the signal QB goes LOW, the transistor 308 turns ON and the node OUT rises toward $V_{DD}$. This will cause the transistor 354 to turn OFF and the node 356 is isolated from $V_{DD}$. Also, as voltage at the node 366 rises, the transistor 358 will turn ON pulling the node 356 toward $V_{SS}$. Eventually, the output of the inverter 360 will transition from LOW to HIGH. This turns the transistor 372 ON. But because the signal QB is low, the transistor 374 is OFF and the node OUT remains isolated from $V_{SS}$.

One or ordinary skill in the art will recognize many variations to the circuit 350 are possible such as variations discussed above with respect to FIG. 4.

A circuit such as the circuit 300 and the circuit 350 may be utilized in a variety of devices that require the conversion of a logic signal into a signal having a reduced range. As just one example, such a circuit may be utilized in current steering DACs. More generally, such a circuit may be utilized in a variety of electronic devices such as communication devices, computation devices, storage devices, networking devices, measurement devices, etc. Referring now to FIGS. 6A-6H, a few specific examples of devices that may utilize a circuit such as such as the circuit 300 or the circuit 350 will be described.

Figure 6A:
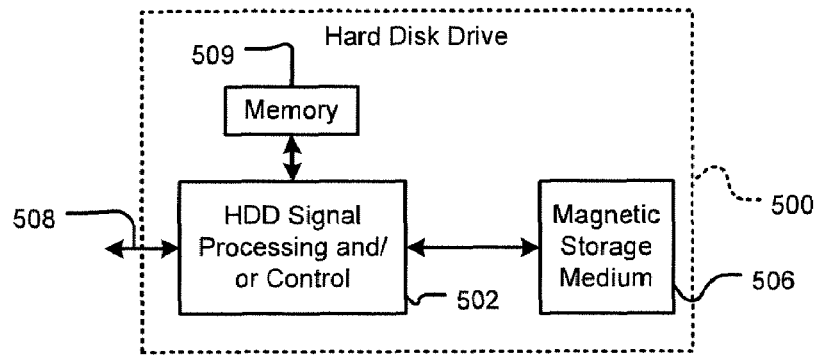
FIG. 6A is a block diagram of a hard disk drive system that may utilize a circuit such as the circuit of FIG. 4 or the circuit of FIG. 5.

For example, referring to FIG. 6A, a hard disk drive 500 may include a circuit such as the circuit 300 or the circuit 350. For example, signal processing and/or control circuits, which are generally identified in FIG. 6A at 502, may include a circuit such as the circuit 300 or the circuit 350. For instance, signal processing and/or control circuits 502 may include one or more current steering DACs. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a low latency nonvolatile memory such as flash memory, read only memory (ROM) and/or other suitable electronic data storage.

Figure 6B:
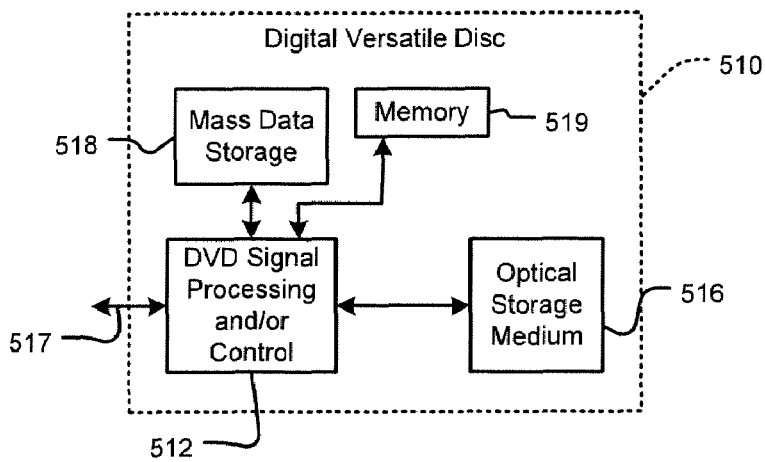
FIG. 6B is a block diagram of a digital versatile drive system that may utilize a circuit such as the circuit of FIG. 4 or the circuit of FIG. 5.

Referring now to FIG. 6B, a circuit such as the circuit 300 or the circuit 350 may be utilized in a digital versatile disc (DVD) drive 510. A circuit such as the circuit 300 or the circuit 350 may be utilized in either or both signal processing and/or control circuits, which are generally identified in FIG. 6B at 512, and/or mass data storage 518 of DVD drive 510. For instance, signal processing and/or control circuits 512 and/or the mass storage device 518 may include one or more current steering DACs. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 6B. The HDD may be a mini HDD that includes one or more platters having a diameter that is smaller than approximately 1.8"DVD 510 may be connected to memory 519, such as RAM, ROM, low latency nonvolatile memory such as flash memory, and/or other suitable electronic data storage.

Figure 6C:
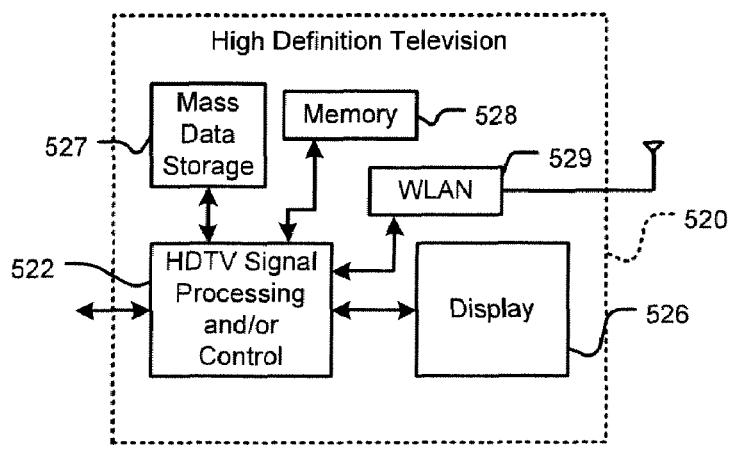
FIG. 6C is a block diagram of a high definition television that may utilize a circuit such as the circuit of FIG. 4 or the circuit of FIG. 5.

Referring to FIG. 6C, a circuit such as the circuit 300 or the circuit 350 may be utilized in a high definition television (HDTV) 520. The HDTV 520 includes signal processing and/or control circuits, which are generally identified in FIG. 6C at 522, a WLAN interface 529, and a mass data storage 527. A circuit such as the circuit 300 or the circuit 350 may be utilized in the WLAN interface 529 or the signal processing circuit and/or control circuit 522, for example. For instance, the WLAN interface 529 and/or signal processing and/or control circuits 522 may include one or more current steering DACs. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. The mass data storage 527 may include one or more hard disk drives (HDDs) and/or one or more digital versatile disks (DVDs). At least one HDD may have the configuration shown in FIG. 6A and/or at least one DVD may have the configuration shown in FIG. 6B. One or more of the HDDs may be a mini HDD that includes one or more platters having a diameter that is smaller than approximately 1.8"HDTV 520 may be connected to memory 528 such as RAM, ROM, low latency nonvolatile memory such as flash memory and/or other suitable electronic data storage. HDTV 520 also may support connections with a WLAN via a WLAN network interface 529.

Figure 6D:
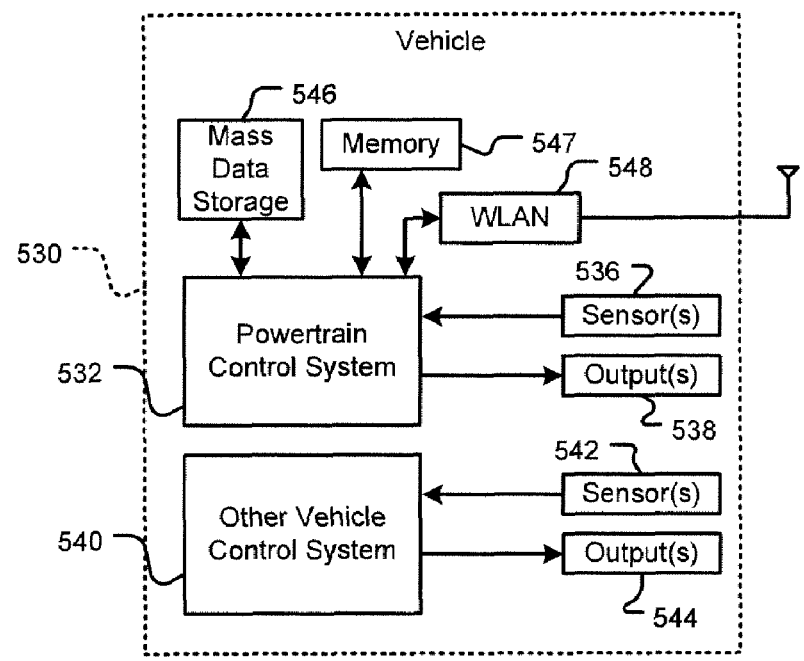
FIG. 6D is a block diagram of a vehicle that may utilize a circuit such as the circuit of FIG. 4 or the circuit of FIG. 5.

Referring now to FIG. 6D, a circuit such as the circuit 300 or the circuit 350 may be utilized in a control system of a vehicle 530. In some implementations, a circuit such as the circuit 300 or the circuit 350 may be utilized by a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals. For instance, the powertrain control system 532 may include one or more current steering DACs.

A circuit such as the circuit 300 or the circuit 350 may be utilized in other control systems 540 of vehicle 530. For instance, control systems 540 may include one or more current steering DACs. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 6A and/or at least one DVD may have the configuration shown in FIG. 6B. One or more of the HDDs may be a mini HDD that includes one or more platters having a diameter that is smaller than approximately 1.8"Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The WLAN interface 548 may include a circuit such as the circuit 300 or the circuit 350. For instance, the WLAN interface 548 may include one or more current steering DACs. The control system 540 may also include mass data storage, memory and/or a WLAN interface (all not shown).

Figure 6E:
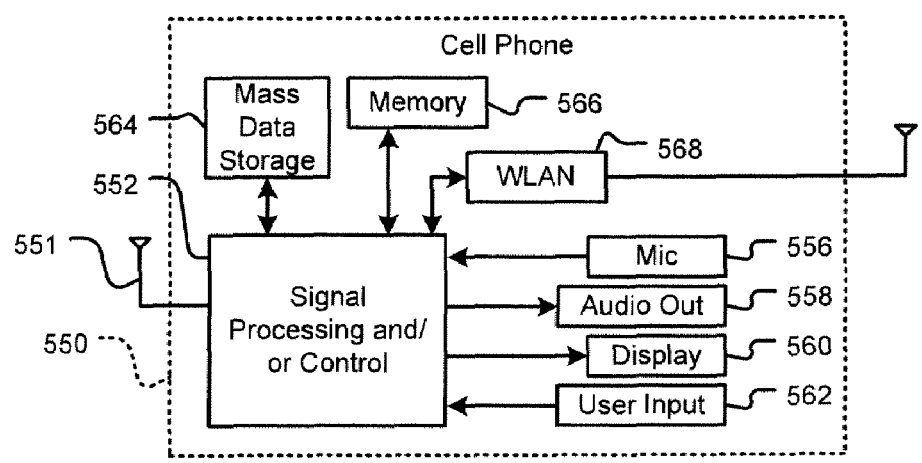
FIG. 6E is a block diagram of a cellular phone that may utilize a circuit such as the circuit of FIG. 4 or the circuit of FIG. 5.

Referring now to FIG. 6E, a circuit such as the circuit 300 or the circuit 350 may be utilized in a cellular phone 550 that may include a cellular antenna 551. The cellular phone 550 includes signal processing and/or control circuits, which are generally identified in FIG. 6E at 552, a WLAN interface 568, and a mass data storage 564. A circuit such as the circuit 300 or the circuit 350 may be utilized in the signal processing and/or control circuits 552 and/or the WLAN interface 568, for example. For instance, the signal processing and/or control circuits and/or the WLAN interface 568 may include one or more current steering DACs. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. At least one HDD may be a mini HDD that includes one or more platters having a diameter that is smaller than approximately 1.8"Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568.

Figure 6F:
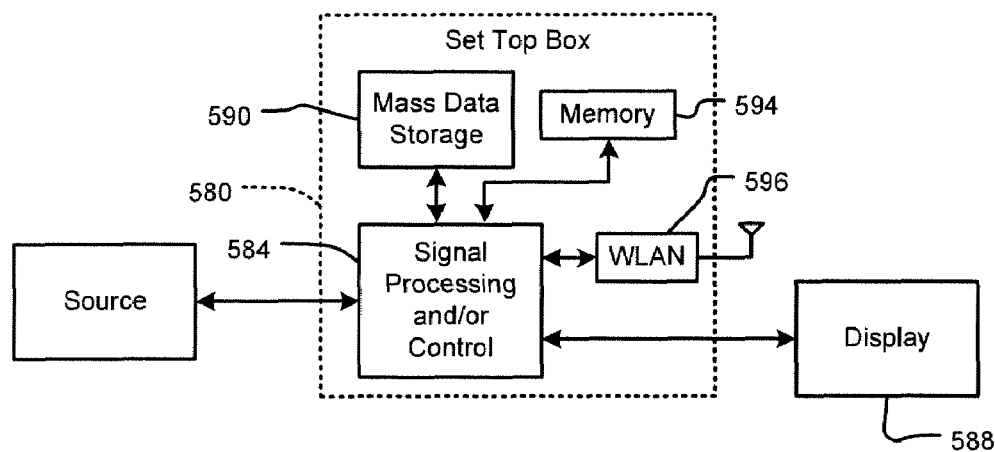
FIG. 6F is a block diagram of a set top box that may utilize a circuit such as the circuit of FIG. 4 or the circuit of FIG. 5.

Referring now to FIG. 6F, a circuit such as the circuit 300 or the circuit 350 may be utilized in a set top box 580. The set top box 580 includes signal processing and/or control circuits, which are generally identified in FIG. 6F at 584, a WLAN interface 596, and a mass data storage device 590. A circuit such as the circuit 300 or the circuit 350 may be utilized in the signal processing and/or control circuits 584 and/or the WLAN interface 596, for example. For instance, the signal processing and/or control circuits 584 and/or the WLAN interface 596 may include one or more current steering DACs. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 6A and/or at least one DVD may have the configuration shown in FIG. 6B. At least one HDD may be a mini HDD that includes one or more platters having a diameter that is smaller than approximately 1.8"Set top box 580 may be connected to memory 594 such as RAM, ROM, low latency nonvolatile memory such as flash memory and/or other suitable electronic data storage. Set top box 580 also may support connections with a WLAN via a WLAN network interface 596.

Figure 6G:
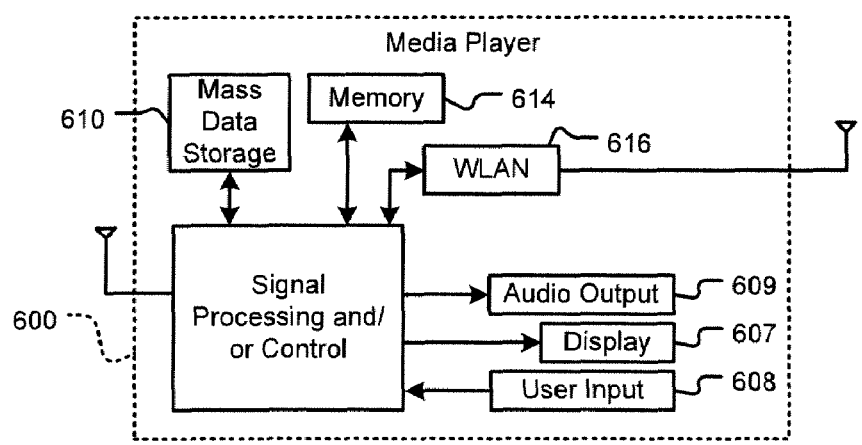
FIG. 6G is a block diagram of a media player that may utilize a circuit such as the circuit of FIG. 4 or the circuit of FIG. 5.

Referring now to FIG. 6G, a circuit such as the circuit 300 or the circuit 350 may be utilized in a media player 600. The media player 600 may include signal processing and/or control circuits, which are generally identified in FIG. 6G at 604, a WLAN interface 616, and a mass data storage device 610. A circuit such as the circuit 300 or the circuit 350 may be utilized in the signal processing and/or control circuits 604 and/or the WLAN interface 616, for example. For instance, the signal processing and/or control circuits 604 and/or the WLAN interface 616 may include one or more current steering DACs. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. At least one HDD may be a mini HDD that includes one or more platters having a diameter that is smaller than approximately 1.8"Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

Figure 6H:
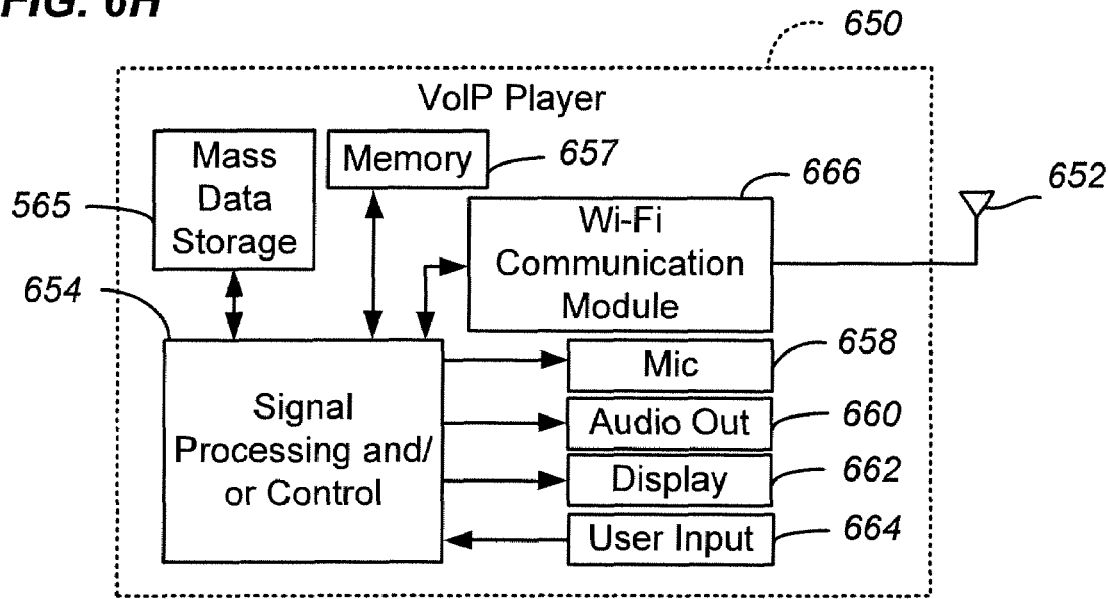
FIG. 6H is a block diagram of a voice over IP device that may utilize a circuit such as the circuit of FIG. 4 or the circuit of FIG. 5.

Referring to FIG. 6H, a circuit such as the circuit 300 or the circuit 350 may be utilized in a Voice over Internet Protocol (VoIP) phone 650 that may include an antenna 654, signal processing and/or control circuits 658, a wireless interface 662, and a mass data storage 666. A circuit such as the circuit 300 or the circuit 350 may be utilized in the signal processing and/or control circuits 658 and/or the wireless interface 662, for example. For instance, the signal processing and/or control circuits 658 and/or the wireless interface 662 may include one or more current steering DACs. In some implementations, VoIP phone 650 includes, in part, a microphone 670, an audio output 674 such as a speaker and/or audio output jack, a display monitor 678, an input device 682 such as a keypad, pointing device, voice actuation and/or other input devices, and a Wireless Fidelity (Wi-Fi) communication module 662. Signal processing and/or control circuits 658 and/or other circuits (not shown) in VoIP phone 650 may process data, perform coding and/or encryption, perform calculations, format data and/or perform other VoIP phone functions.

VoIP phone 650 may communicate with mass data storage 666 that stores data in a nonvolatile manner such as optical and/or magnetic storage devices, for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8"VoIP phone 650 may be connected to memory 686, which may be a RAM, ROM, low latency nonvolatile memory such as flash memory and/or other suitable electronic data storage. VoIP phone 650 is configured to establish communications link with a VoIP network (not shown) via Wi-Fi communication module 662.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A circuit to convert a first logic signal having a first range to a second logic signal having a second range, comprising:
   a first metal oxide semiconductor (MOS) transistor to selectively couple an output node to a first reference voltage when the output node is to be in a first state;
   a second MOS transistor having a source coupled to the output node and a gate coupled to a bias voltage;
   a current source circuit to selectively bias the second MOS transistor to act as part of a source-follower circuit when the output node is to be in a second state;
   a memory circuit having an input coupled to the output node and an output, the memory circuit configured to temporarily store a value indicative of the output node in the first state when the output node transitions from the first state to the second state; and
   a discharging circuit coupled to the output node and a second reference voltage, the discharging circuit configured to temporarily provide a discharging path between the output node and the second reference voltage when the output node is transitioning from the first state to the second state, the discharging circuit having a first input coupled to the output of the memory circuit and a second input coupled to a control signal, the control signal to indicate that the output node is to transition from the first state to the second state.

2. A circuit according to claim 1, wherein the memory circuit is configured to store the value indicative of the output node in the first state approximately until the output node reaches the second state.

3. A circuit according to claim 1, wherein the memory circuit stores Boolean values.

4. A circuit according to claim 1, wherein the discharging circuit comprises a third MOS transistor and a fourth MOS transistor coupled in series between the output node and the second reference voltage, the third MOS transistor having a gate coupled to the output of the memory circuit, the fourth MOS transistor having a gate coupled to the control signal.

5. A circuit according to claim 4, wherein the current source circuit comprises:
   a current source;
   a fifth MOS transistor coupled to the current source and the second MOS transistor to selectively couple the current source to the second MOS transistor; and
   a sixth MOS transistor coupled to the current source and a diverting node to selectively couple the current source to the diverting node.

6. A circuit according to claim 5, wherein the first MOS transistor comprises a p-channel MOS transistor having a source coupled to the first reference voltage, a drain coupled to the output node, and a gate coupled to the control signal;
   wherein the second MOS transistor comprises an n-channel MOS transistor having a drain coupled to the first reference voltage;
   wherein the third MOS transistor comprises an n-channel MOS transistor having a drain coupled to the output node;
   wherein the fourth MOS transistor comprises an n-channel MOS transistor having a drain coupled to a source of the third MOS transistor and a source coupled to the second reference voltage;
   wherein the fifth MOS transistor comprises an n-channel MOS transistor having a drain coupled to the source of the second MOS transistor, a source coupled to the current source, and a gate coupled to the control signal; and
   wherein the sixth MOS transistor comprises an n-channel MOS transistor having a drain coupled to the first reference voltage, a source coupled to the current source, and a gate coupled to a logical complement of the control signal.

7. A circuit according to claim 1, wherein the current source circuit comprises a controllable current source that selectively supplies current when the output node is to be in the second state.

8. A circuit according to claim 1, wherein the source-follower circuit is configured to keep a voltage of the output node in the second state at a desired steady-state voltage, wherein the desired steady-state voltage is a voltage in an approximate range of 100 millivolts to 350 millivolts.

9. A circuit to convert a first logic signal having a first range to a pair of complementary second logic signals having a second range, comprising:
   a first metal oxide semiconductor (MOS) transistor to selectively couple a first output node to a first reference voltage when the first output node is to be in a first state;
   a second MOS transistor having a source coupled to the first output node and a gate coupled to a bias voltage;
   a third MOS transistor to selectively couple a second output node to the first reference voltage when the second output node is to be in the first state;
   a fourth MOS transistor having a source coupled to the second output node and a gate coupled to the bias voltage;
   a current source circuit to selectively bias the second MOS transistor to act as part of a first source-follower circuit when the first output node is to be in a second state and to selectively bias the fourth MOS transistor to act as part of a second source-follower circuit when the second output node is to be in the second state;
   a memory circuit having a first input coupled to the first output node, a second input coupled to the second output node, a first output, and a second output, the memory circuit configured to temporarily store a first value indicative of the first output node in the first state when the first output node transitions from the first state to the second state and to temporarily store a second value indicative of the second output node in the first state when the second output node transitions from the first state to the second state;
   a first discharging circuit coupled to the first output node and a second reference voltage, the first discharging circuit configured to temporarily provide a discharging path between the first output node and the second reference voltage when the first output node is transitioning from the first state to the second state, the first discharging circuit having a first input coupled to the first output of the memory circuit and a second input coupled to a first control signal, the first control signal indicating that the first output node is to transition from the first state to the second state; and a second discharging circuit coupled to the second output node and the second reference voltage, the second discharging circuit configured to temporarily provide a discharging path between the second output node and the second reference voltage when the second output node is transitioning from the first state to the second state, the second discharging circuit having a first input coupled to the second output of the memory circuit and a second input coupled to a second control signal, the second control signal indicating that the second output node is to transition from the first state to the second state.

10. A circuit according to claim 9, wherein the memory circuit stores Boolean values.

11. A circuit according to claim 9, wherein the memory circuit is configured to store the first value indicative of the first output node in the first state approximately until the first output node reaches the second state and to store the second value indicative of the second output node in the first state approximately until the second output node reaches the second state.

12. A circuit according to claim 9, wherein the first discharging circuit comprises a fifth MOS transistor and a sixth MOS transistor coupled in series between the first output node and the second reference voltage, the fifth MOS transistor having a gate coupled to the first output of the memory circuit, the sixth MOS transistor having a gate coupled to the first control signal.

13. A circuit according to claim 12, wherein the second discharging circuit comprises a seventh MOS transistor and an eighth MOS transistor coupled in series between the second output node and the second reference voltage, the seventh MOS transistor having a gate coupled to the second output of the memory circuit, the eighth MOS transistor having a gate coupled to the second control signal.

14. A circuit according to claim 13, wherein the memory circuit comprises a latch circuit.

15. A circuit according to claim 14, wherein the memory circuit comprises:

a first inverter;

a second inverter;

a ninth MOS transistor coupled in series between the first reference voltage and an input of the first inverter, the ninth MOS transistor having a gate coupled to the first output node;

a tenth MOS transistor coupled in series between the second reference voltage and the input of the first inverter, the tenth MOS transistor having a gate coupled to an input of the second inverter;

an eleventh MOS transistor coupled in series between the first reference voltage and an input of the second inverter, the eleventh MOS transistor having a gate coupled to the second output node;

a twelfth MOS transistor coupled in series between the second reference voltage and the input of the second inverter, the tenth MOS transistor having a gate coupled to the input of the first inverter.

16. A circuit according to claim 15, wherein the current source circuit comprises:

a current source;

a thirteenth MOS transistor coupled between the second MOS transistor and the current source to selectively couple the current source to the second MOS transistor; and a fourteenth MOS transistor coupled between the fourth MOS transistor and the current source to selectively couple the current source to the fourth MOS transistor.

17. A circuit according to claim 16, wherein a gate of the first MOS transistor is coupled to the first control signal;

wherein a gate of the third MOS transistor is coupled to the second control signal;

wherein a gate of the sixth MOS transistor is coupled to the first control signal;

wherein a gate of the eighth MOS transistor is coupled to the second control signal;

wherein a gate of the thirteenth MOS transistor is coupled to the first control signal; and wherein a gate of the fourteenth MOS transistor is coupled to the second control signal.

18. A circuit according to claim 17, wherein a source of the first MOS transistor is coupled to the first reference voltage, and a drain of the first MOS transistor is coupled to the first output node;

wherein a drain of the second MOS transistor is coupled to the first reference voltage;

wherein a source of the third MOS transistor is coupled to the first reference voltage, and a drain of the third MOS transistor is coupled to the second output node;

wherein a drain of the fourth MOS transistor is coupled to the first reference voltage;

wherein a drain of the fifth MOS transistor is coupled to the first output node;

wherein a drain of the sixth MOS transistor is coupled to a source of the fifth MOS transistor and a source of the sixth MOS transistor is coupled to the second reference voltage;

wherein a drain of the seventh MOS transistor is coupled to the second output node;

wherein a drain of the eighth MOS transistor is coupled to a source of the seventh MOS transistor and a source of the eighth MOS transistor is coupled to the second reference voltage;

wherein a source of the ninth MOS transistor is coupled to the first reference voltage and a drain of the ninth MOS transistor is coupled to the input of the first inverter;

wherein a source of the tenth MOS transistor is coupled to the second reference voltage and a drain of the tenth MOS transistor is coupled to the input of the first inverter;

wherein a source of the eleventh MOS transistor is coupled to the first reference voltage and a drain of the eleventh MOS transistor is coupled to the input of the second inverter;

wherein a source of the twelfth MOS transistor is coupled to the second reference voltage and a drain of the twelfth MOS transistor is coupled to the input of the second inverter;

wherein a source of the thirteenth MOS transistor is coupled to the current source and a drain of the thirteenth MOS transistor is coupled to the source of the second MOS transistor; and wherein a source of the fourteenth MOS transistor is coupled to the current source and a drain of the fourteenth MOS transistor is coupled to the source of the fourth MOS transistor.

19. A circuit according to claim 18, wherein the first, third, ninth and eleventh MOS transistors are p-channel MOS (PMOS) transistors;

wherein the second, fourth, fifth, sixth, seventh, eighth, tenth, twelfth, thirteenth and fourteenth MOS transistors are n-channel MOS (NMOS) transistors.

20. A circuit according to claim 17, further comprising a flip-flop having an input, a first output, and a second output, the second output a complement of the first output;
wherein the first logic signal is coupled to the input of the flip-flop;
wherein the first control signal is coupled to the first output of the flip-flop;
wherein the second control signal is coupled to the second output of the flip-flop.

21. A circuit according to claim 17, further comprising a third inverter having an input and an output;
wherein the input of the third inverter is coupled to the first logic signal;
wherein the first control signal is coupled to the output of the third inverter;
wherein the second control signal is coupled to the input of the driver circuit.

22. A circuit according to claim 9, wherein the first source-follower circuit is configured to keep a voltage of the first output node in the second state at a desired steady-state voltage, wherein the desired steady-state voltage is a voltage in an approximate range of 100 millivolts to 350 millivolts.

23. A circuit according to claim 22, wherein the second source-follower circuit is configured to keep a voltage of the second output node in the second state at the desired steady-state voltage.

24. A circuit to convert a first logic signal having a first range to at least one second logic signal having a second range, comprising:
a first p-channel metal oxide semiconductor (PMOS) transistor having a gate coupled to a first control signal, a source coupled to a first reference voltage, and a drain coupled to a first output node;
a first n-channel metal oxide semiconductor (NMOS) transistor having a source coupled to the first output node and a gate coupled to a first bias voltage;
a current source circuit having a first input coupled to the first control signal to selectively bias the first NMOS transistor to act as part of a first source-follower circuit when the first control signal is HIGH;
a memory circuit having a first input coupled to the first output node and a first output, the memory circuit configured to temporarily store a representative value of the first output node when the first control signal changes from LOW to HIGH; and
a first discharging circuit coupled to the first output node and a second reference voltage, the first discharging circuit configured to temporarily provide a discharging path between the first output node and the second reference voltage after the first control signal changes from LOW to HIGH, the first discharging circuit having a first input coupled to the first output of the memory circuit and a second input coupled to the first control signal;
wherein a steady-state voltage of the first output node when the first control signal is HIGH is a voltage within the range 100 millivolts and 350 millivolts, inclusive.

25. A circuit according to claim 24, wherein the circuit is to convert the first logic signal to a pair of complementary second logic signals having the second range, the circuit further comprising:
a second p-channel metal oxide semiconductor (PMOS) transistor having a gate coupled to a second control signal, a source coupled to the first reference voltage, and a drain coupled to a second output node;
a second n-channel metal oxide semiconductor (NMOS) transistor having a source coupled to the second output node and a gate coupled to a second bias voltage;
wherein the current source circuit includes a second input coupled to the second control signal to selectively bias the second NMOS transistor to act as part of a second source-follower circuit when the second control signal is HIGH;
wherein the memory circuit includes a second input coupled to the second output node and a second output, the memory circuit further configured to temporarily store a representative value associated with the second output node when the second control signal changes from LOW to HIGH; and
a second discharging circuit coupled to the second output node and the second reference voltage, the second discharging circuit configured to temporarily provide a discharging path between the second output node and the second reference voltage after the second control signal changes from LOW to HIGH, the second discharging circuit having a first input coupled to the second output of the memory circuit and a second input coupled to the second control signal;
wherein a steady-state voltage of the second output node when the second control signal is HIGH is a voltage within the range 100 millivolts and 350 millivolts, inclusive.

26. A circuit according to claim 25, wherein the memory circuit stores Boolean values.

27. A circuit according to claim 25, wherein the first bias voltage is the same as the second bias voltage.

28. A circuit according to claim 25, further comprising a flip-flop having an input, a first output, and a second output, the second output a complement of the first output;
wherein the first logic signal is coupled to the input of the flip-flop;
wherein the first output of the flip-flop is coupled to the first control signal;
wherein the second output of the flip-flop is coupled to the second control signal.

29. A circuit according to claim 25, further comprising an inverter having an input coupled to the first logic signal and an output;
wherein the first logic signal is coupled to the second control signal;
wherein the output of the inverter is coupled to the first control signal.

30. A circuit according to claim 25, wherein the current source circuit comprises:
a current source;
a third NMOS transistor having a source coupled to the current source, a drain coupled to the source of the first NMOS transistor, and a gate coupled to the first control signal; and
a fourth NMOS transistor having a source coupled to the current source, a drain coupled to the source of the second NMOS transistor, and a gate coupled to the second control signal.

31. A circuit according to claim 25, wherein the memory circuit comprises a latch.

32. A circuit according to claim 25, wherein the first discharging circuit comprises a third n-channel metal oxide semiconductor (NMOS) transistor and a fourth NMOS transistor coupled in series between the first output node and the second reference voltage, the third NMOS transistor having a gate coupled to the first output of the memory circuit, the fourth NMOS transistor having a gate coupled to the first control signal;
wherein the second discharging circuit comprises a fifth NMOS transistor and a sixth NMOS transistor coupled in series between the second output node and the second reference voltage, the fifth NMOS transistor having a gate coupled to the second output of the memory circuit, the sixth NMOS transistor having a gate coupled to the second control signal.

33. A cell of a current steering digital-to-analog converter, comprising:
a cell current source;
a first metal oxide semiconductor (MOS) transistor coupled in series with the current source and coupled to a current summing line;
a second MOS transistor coupled in series with the current source and coupled to a reference node;
a driver circuit having an input, a first output coupled to a gate of the first MOS transistor, and a second output coupled to a gate of the second MOS transistor;
wherein the driver circuit comprises:
a third MOS transistor to selectively couple the first output of the driver circuit to a first reference voltage when the first output of the driver circuit is to be in a first state;
a fourth MOS transistor having a source coupled to the first output of the driver circuit and a gate coupled to a bias voltage;
a fifth MOS transistor to selectively couple the second output of the driver circuit to the first reference voltage when the second output of the driver circuit is to be in the first state;
a sixth MOS transistor having a source coupled to the second output of the driver circuit and a gate coupled to the bias voltage;
a driver circuit current source circuit to selectively bias the fourth MOS transistor to act as part of a first source-follower circuit when the first output of the driver circuit is to be in a second state and to selectively bias the sixth MOS transistor to act as part of a second source-follower circuit when the second output of the driver circuit is to be in the second state;
a memory circuit having a first input coupled to the first output of the driver circuit, a second input coupled to the second output of the driver circuit, a first output, and a second output, the memory circuit configured to temporarily store a first representative value associated with the first output of the driver circuit when the first output of the driver circuit transitions from the first state to the second state and to temporarily store a second representative value associated with the second output of the driver circuit when the second output of the driver circuit transitions from the first state to the second state;
a first discharging circuit coupled to the first output of the driver circuit and a second reference voltage, the first discharging circuit configured to temporarily provide a discharging path between the first output of the driver circuit and the second reference voltage when the first output of the driver circuit is transitioning from the first state to the second state, the first discharging circuit having a first input coupled to the first output of the memory circuit and a second input coupled to a first control signal, the first control signal indicating that the first output of the driver circuit is to transition from the first state to the second state; and
a second discharging circuit coupled to the second output of the driver circuit and the second reference voltage, the second discharging circuit configured to temporarily provide a discharging path between the second output of the driver circuit and the second reference voltage when the second output of the driver circuit is transitioning from the first state to the second state, the second discharging circuit having a first input coupled to the second output of the memory circuit and a second input coupled to a second control signal, the second control signal indicating that the second output of the driver circuit is to transition from the first state to the second state;
wherein a steady-state voltage of the first output of the driver circuit in the second state is a voltage within the range 100 millivolts to 350 millivolts, inclusive;
wherein a steady-state voltage of the second output of the driver circuit in the second state is a voltage within the range 100 millivolts to 350 millivolts, inclusive.

34. A circuit according to claim 33, wherein the driver circuit further comprises a flip-flop having an input, a first output, and a second output, the second output a complement of the first output;
wherein the input of the driver circuit is coupled to the input of the flip-flop;
wherein the first output of the flip-flop is coupled to a gate of the third MOS transistor, a first input of the driver circuit current source circuit, and the second input of the first discharging circuit;
wherein the second output of the flip-flop is coupled to a gate of the fifth MOS transistor, a second input of the driver circuit current source circuit, and the second input of the second discharging circuit.

35. A circuit according to claim 33, where the driver circuit further comprises an inverter having an input and an output;
wherein the input of the inverter is coupled to the input of the driver circuit;
wherein the input of the driver circuit is coupled to a gate of the fifth MOS transistor, a second input of the driver circuit current source circuit, and the second input of the second discharging circuit;
wherein the output of the inverter is coupled to a gate of the third MOS transistor, a first input of the driver circuit current source circuit, and the second input of the first discharging circuit.

36. A circuit according to claim 33, wherein the driver circuit current source circuit comprises:
a driver circuit current source;
a seventh MOS transistor coupled in series between the fourth MOS transistor and the driver circuit current source, the seventh MOS transistor having a gate coupled to the first control signal; and
an eighth MOS transistor coupled in series between the sixth MOS transistor and the driver circuit current source, the eighth MOS transistor having a gate coupled to the second control signal.

37. A circuit according to claim 33, wherein the memory circuit comprises a latch.

38. A circuit according to claim 33, wherein the first discharging circuit comprises a seventh MOS transistor and an eighth MOS transistor coupled in series between the first output of the driver circuit and the second reference voltage, the seventh MOS transistor having a gate coupled to the first output of the memory circuit, the eighth MOS transistor having a gate coupled to the first control signal;
wherein the second discharging circuit comprises a ninth MOS transistor and a tenth MOS transistor coupled in series between the second output of the driver circuit and the second reference voltage, the ninth MOS transistor having a gate coupled to the second output of the memory circuit, the tenth MOS transistor having a gate coupled to the second control signal.

* * * * *